US008861204B2

(12) United States Patent
Zhang et al.

(10) Patent No.: US 8,861,204 B2
(45) Date of Patent: Oct. 14, 2014

(54) ELECTRICAL CONNECTOR ASSEMBLY HAVING ELECTRICAL CONNECTOR AND FILTER MODULE

(75) Inventors: Jie Zhang, Kunshan (CN); Jian-She Hu, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 391 days.

(21) Appl. No.: 13/290,336

(22) Filed: Nov. 7, 2011

(65) Prior Publication Data

US 2012/0113602 A1 May 10, 2012

(30) Foreign Application Priority Data

Nov. 5, 2010 (CN) .......................... 2010 2 0593465

(51) Int. Cl.

*H05K 1/00* (2006.01)
*H05K 1/18* (2006.01)
*H05K 7/00* (2006.01)
*H01R 12/72* (2011.01)
*H01R 24/64* (2011.01)
*H01R 13/719* (2011.01)

(52) U.S. Cl.

CPC .............. *H01R 12/724* (2013.01); *H01R 24/64* (2013.01); *H01R 13/719* (2013.01)
USPC ...................................... 361/748; 439/620.17

(58) Field of Classification Search

CPC .... H01R 13/6658; H01R 12/57; H01R 12/50; H01R 12/51; H01R 12/724; H01R 24/64; H01R 17/719; H05K 1/141; H05K 1/182
USPC ........... 439/620.06, 620.07, 620.17; 361/748, 361/760–783
See application file for complete search history.

(56) References Cited

U.S. PATENT DOCUMENTS

| | | | | |
|---|---|---|---|---|
| 5,069,641 | A * | 12/1991 | Sakamoto et al. | 439/620.22 |
| 6,139,368 | A * | 10/2000 | Bogese, II | 439/620.17 |
| 6,896,553 | B2 * | 5/2005 | Espenshade et al. | 439/620.07 |
| 7,153,163 | B2 * | 12/2006 | Lewis et al. | 439/620.11 |
| 7,749,408 | B2 | 7/2010 | Jen et al. | |
| 2010/0255726 | A1 * | 10/2010 | Huang et al. | 439/607.01 |
| 2010/0297882 | A1 * | 11/2010 | Wu et al. | 439/620.07 |

* cited by examiner

*Primary Examiner* — Bernard Rojas
(74) *Attorney, Agent, or Firm* — Ming Chieh Chang; Wei Te Chung

(57) ABSTRACT

A electrical connector assembly includes a mother board (3) having a number of circuit traces (31), an electrical connector (2) and a number of filter modules mounted on the mother board and situated away from the electrical connector. The electrical connector includes an insulative housing (20) and a number of contact terminals (30) assembled to the insulative housing and being mounted to the mother board along a first direction. The contact terminals are connected to the filter modules via the number of circuit traces of the mother board.

12 Claims, 9 Drawing Sheets

ELECTRICAL CONNECTOR ASSEMBLY HAVING ELECTRICAL CONNECTOR AND FILTER MODULE

BACKGROUND OF THE INVENTION

1. Field of the Invention

The present invention relates to an electrical connector assembly, and more particularly to an electrical connector assembly having a modular jack connector and a filter module applied in high speed signal transmission systems.

2. Description of Related Art

U.S. Pat. No. 7,749,027 issued to Chow et al. on Jul. 6, 2010 discloses an electrical connector assembly comprising a mother board having a plurality of circuit traces, a filter module and a modular jack connector mounted on the mother board. The modular jack connector includes a housing defining a cavity and mounted on the mother board, a paddle board vertically attached to the housing, a plurality of contact terminals assembled to the paddle board and received in the cavity, a converting module assembled to the paddle board and connected to the mother board. The contact terminals are connected to the mother board via the paddle board and the converting module. The electrical connector assembly is electrically connected to the filter module via the circuit traces of the mother board.

The electrical connector assembly includes the housing, the contact terminals, the paddle board, the converting module, and the filter modules to have a completed configuration.

Hence, a differently configured electrical connector assembly is highly desired.

SUMMARY OF THE INVENTION

Accordingly, an object of the present invention is to provide an electrical connector assembly having an electrical connector mounted on a mother board directly to connect with a filter module to simplify the configuration of the electrical connector assembly.

In order to achieve the object set forth, an electrical connector assembly includes a mother board having a plurality of circuit traces, an electrical connector and a plurality of filter modules mounted on the mother board and situated away from the electrical connector. The electrical connector includes an insulative housing and a plurality of contact terminals assembled to the insulative housing and mounted to the mother board along a first direction. The contact terminals are connected to the filter modules via the plurality of circuit traces of the mother board.

A method of manufacturing an electrical connector assembly comprises the steps of: providing a mother board having a plurality of circuit traces; mounting a filter module on the mother board, mounting an electrical connector having an insulative housing and a plurality of contact terminals assembled to the insulative housing on the mother board along an up-to-bottom direction at a position away from the filter module to electrically connect the contact terminals with the filter modules via the circuit traces of the mother board.

The electrical connector assembly has an electrical connector mounted on a mother board directly to connect with a filter module, devoid of a paddle board or a converting module. Such an electrical connector assembly has a simple configuration.

Other objects, advantages and novel features of the invention will become more apparent from the following detailed description when taken in conjunction with the accompanying drawings.

DETAILED DESCRIPTION OF THE PREFERRED EMBODIMENT

Figure 1:
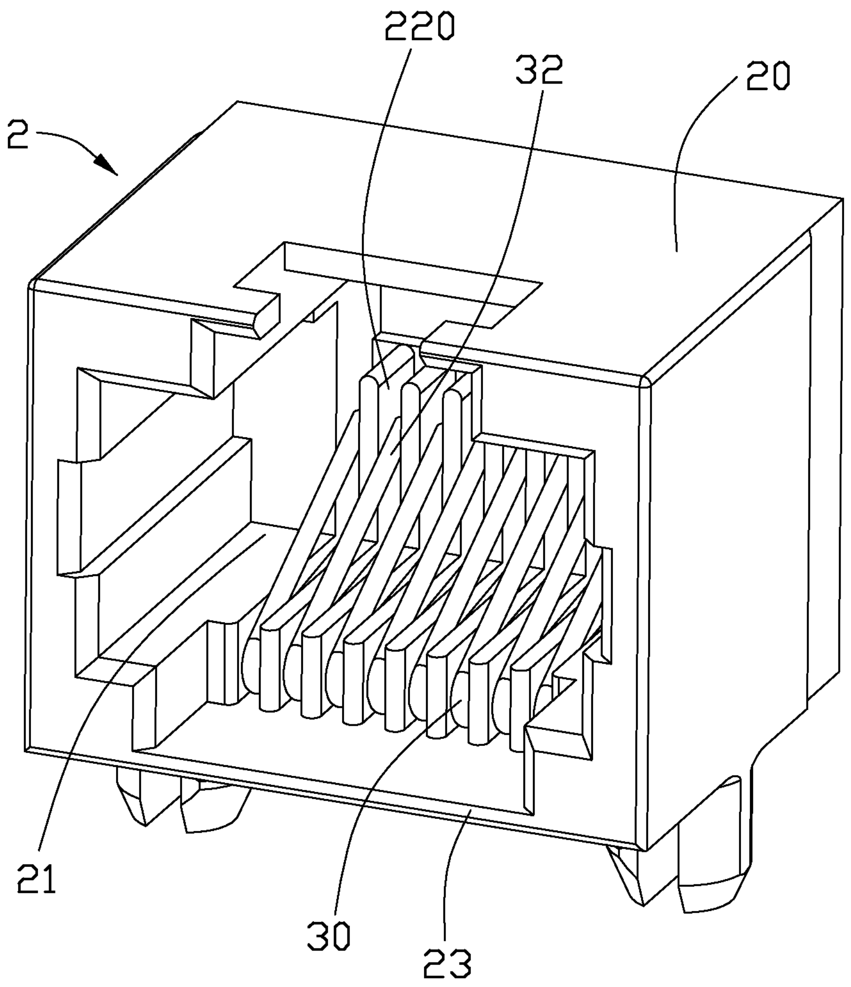
FIG. 1 is an assembled perspective view showing an electrical connector in accordance with a first embodiment of the present invention.
Figure 2:
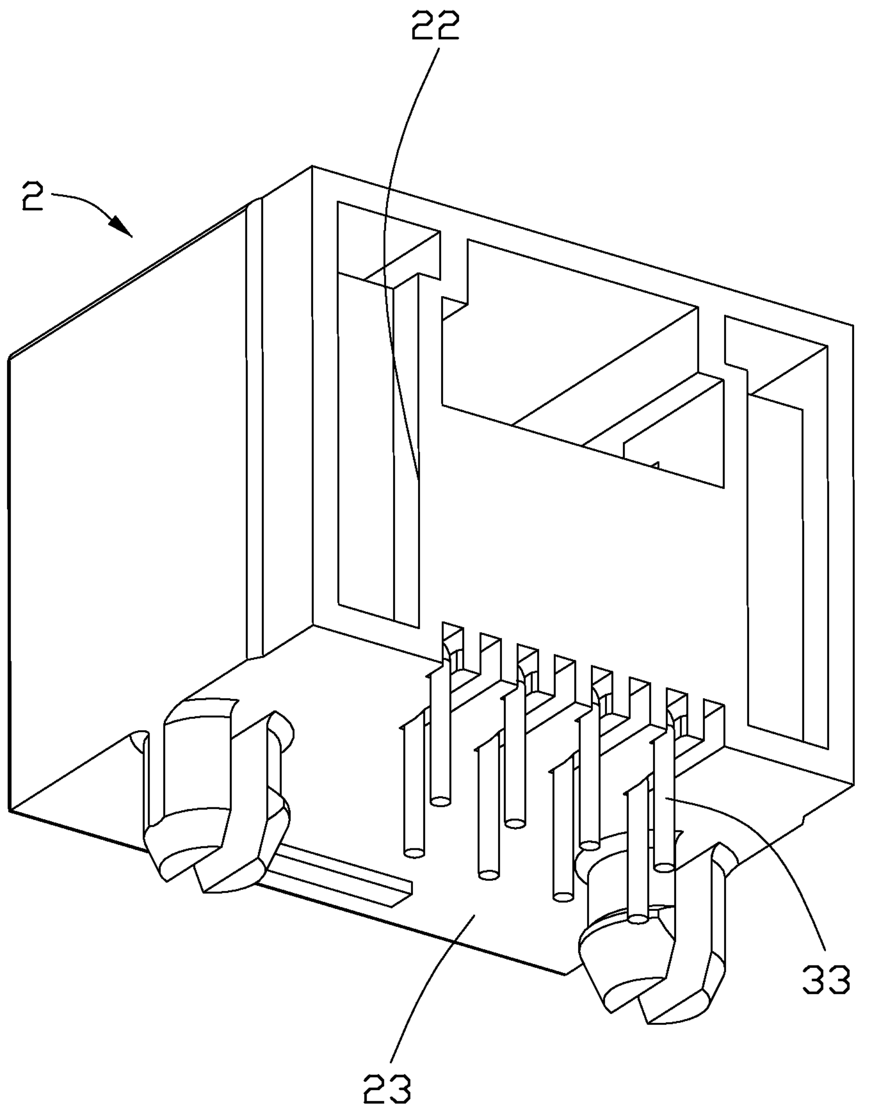
FIG. 2 is another assembled view similar to FIG. 1, taken from another aspect.
Figure 3:
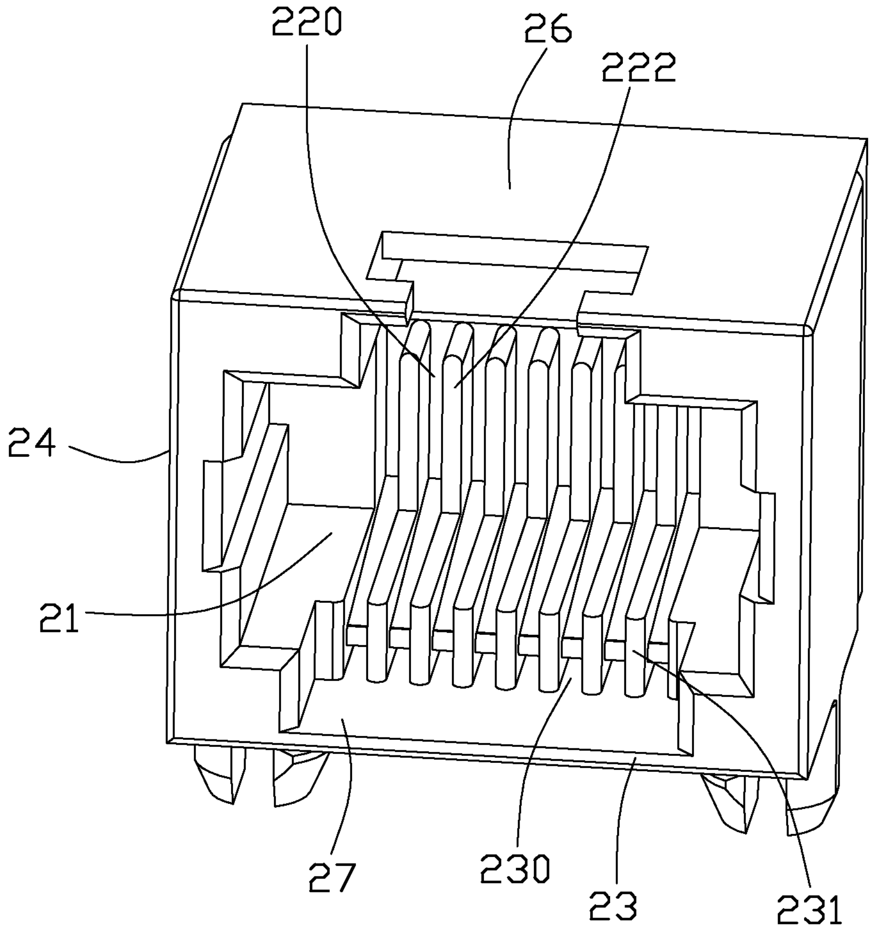
FIG. 3 is a perspective view showing an insulative housing of the electrical connector.
Figure 4:
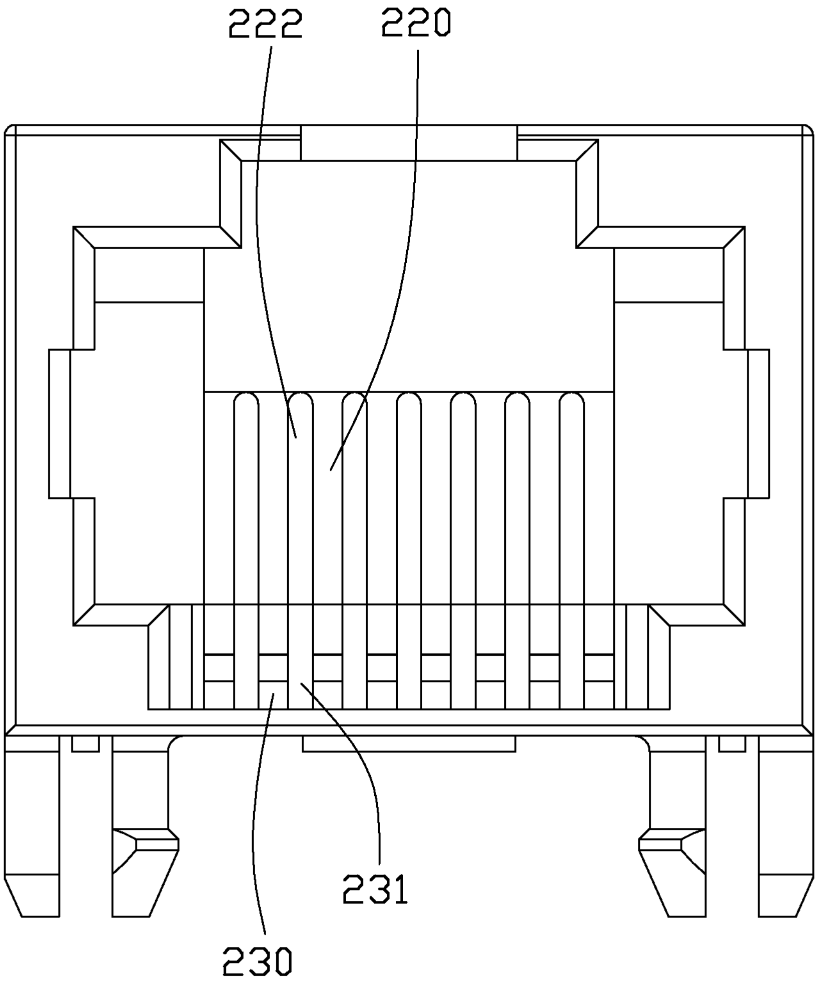
FIG. 4 is a front view showing the insulative housing of the electrical connector.

Reference will now be made in detail to the preferred embodiment of the present invention. Referring to FIGS. 1-6, an electrical connector assembly in accordance with the preferred embodiment of the present invention includes a mother board 3 having a plurality of circuit traces 31, an electrical connector 2 and a plurality of filter modules mounted on the mother board 3.

Referring to FIGS. 1-4, the electrical connector 2 comprises an insulative housing 20 and a plurality of contact terminals 30 assembled to the insulative housing 20.

The insulative housing 20 comprises an opening 27, a first wall 23, a second wall 22 facing the opening 27, a pair of third walls 24, a fourth wall 26 and a cavity 21 surrounded by the first through fourth walls 23, 22, 24, 26. The insulative housing 20 has a plurality of first ribs 231 formed on the first wall 23, and a plurality of passageways 230 each between two adjacent first ribs 231. The insulative housing 20 has a plurality of second ribs 222 formed on the second wall 22 and a plurality of slots 220 each between two adjacent second ribs 222.

Figure 5:
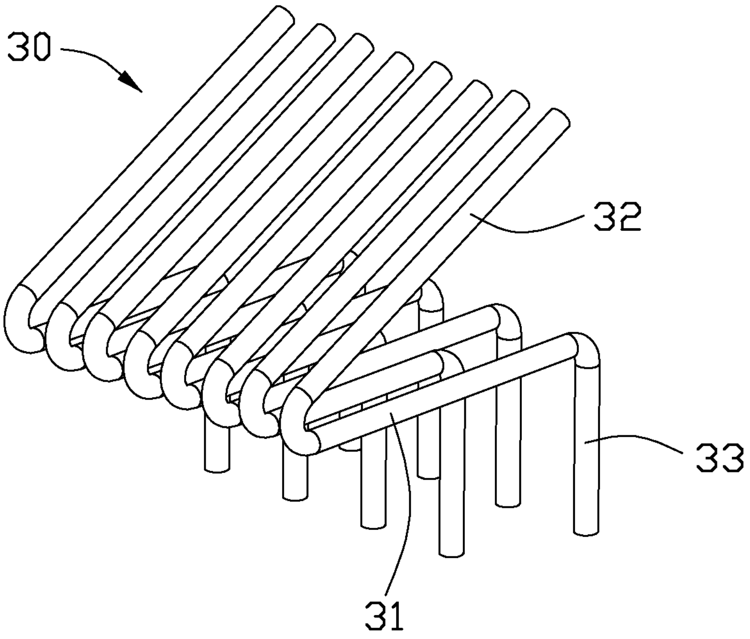
FIG. 5 is a perspective view showing a plurality of contact terminals of the electrical connector.

Referring to FIG. 5, each contact terminal 30 includes a connecting portion 31 extending along the mating direction, a contact portion 32 bent obliquely from a front end of the connecting portion 31, and a mounting portion 33 bent perpendicularly from an opposite end of the connecting portion 31 for being mounted on the mother board.

Referring to FIGS. 1-5, in assembling of the electrical connector 2, the contact terminals 30 are inserted in the insulative housing 20. The mounting portions 33 are bent from the connecting portions 31 in a first step. The connecting portions 31 are inserted through the passageways 230 from a back-to-front direction in a second step. The contact portions 32 are bent obliquely from the connecting portions 31 and positioned in the cavity 21 in a third step, with free ends of the contact portions 32 of the contact terminals 30 respectively confined in the slots 220. A carrier strip of the mounting portions 33 is cut off in a fourth step. The mounting portions 33 of the contact terminals 30 together with the insulative housing 20 are mounted on the mother board 3 along an up-to-bottom direction in a fifth step.

The mother board 3 has a plurality of filter modules mounted thereon and situated away from the electrical connector 2. Each filter module comprises a transformer 4*a* and a common mode choke 5*b*.

Figure 6:
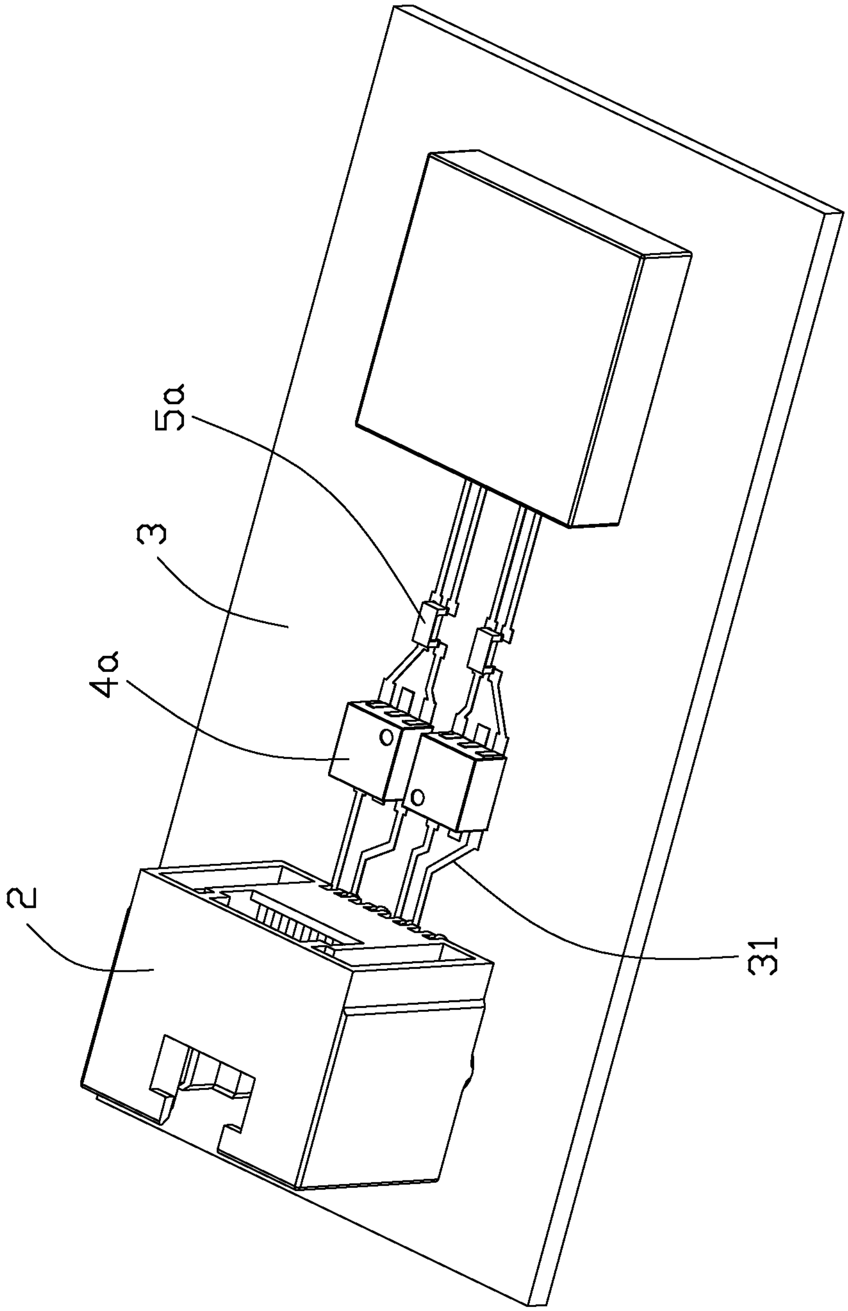
FIG. 6 is an assembled perspective view showing an electrical connector assembly of the first embodiment.

In the first embodiment shown in FIG. 6, the electrical connector 2 is connected to the transformer 4*a* then to the common mode choke 5*a* of one filter module in sequence, via the circuit traces 31. The transformer 4*a* of one filter module and the transformer 4*a* of another filter module are separated from each other. The common mode choke 5*a* of one filter module and the common mode choke 5*a* of another filter module are separated from each other.

Figure 7:
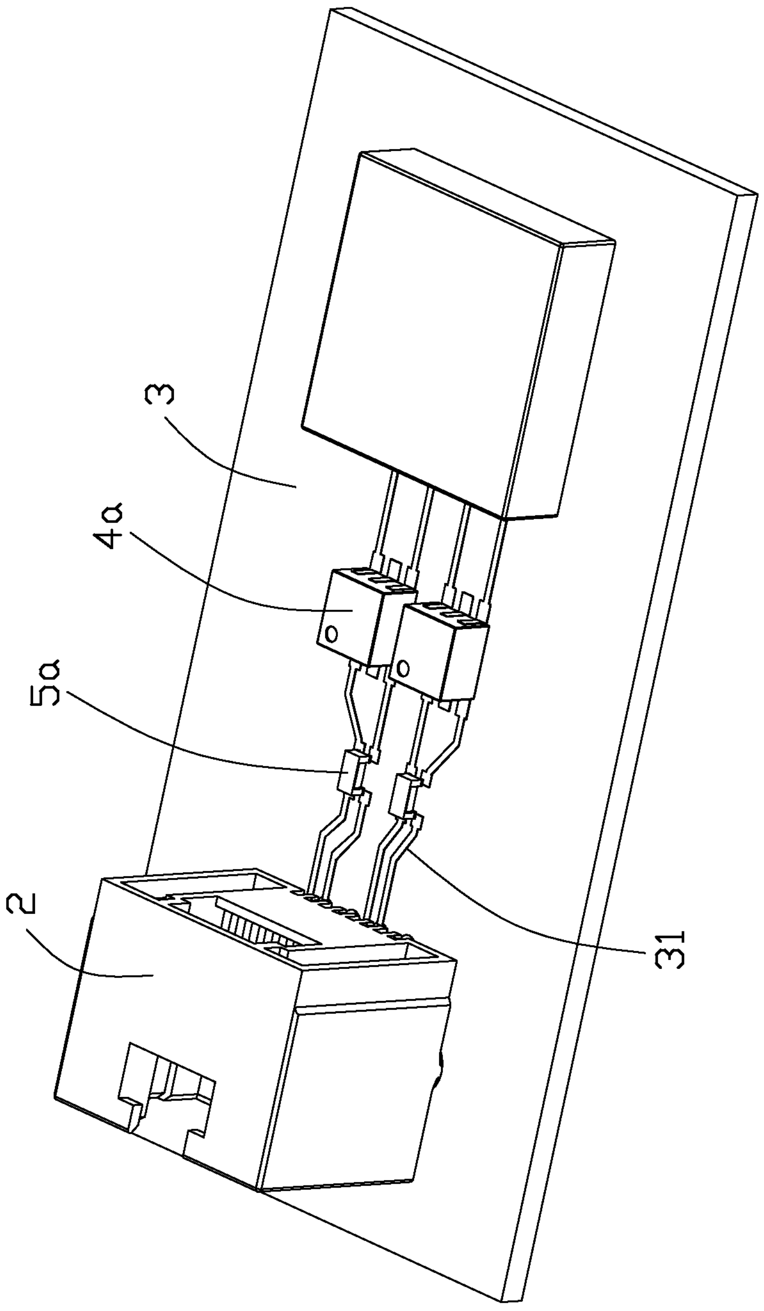
FIG. 7 is an assembled perspective view showing the electrical connector assembly of a second embodiment.

In the second embodiment shown in FIG. 7, the electrical connector 2 is connected to the common mode choke 5*a* then to the transformer 4*a* in sequence, via the circuit traces 31. The common mode choke 5*a* of one filter module and the common mode choke 5*a* of another filter module are separated from each other. The transformer 4*a* of one filter module and the transformer 4*a* of another filter module are separated from each other.

Figure 8:
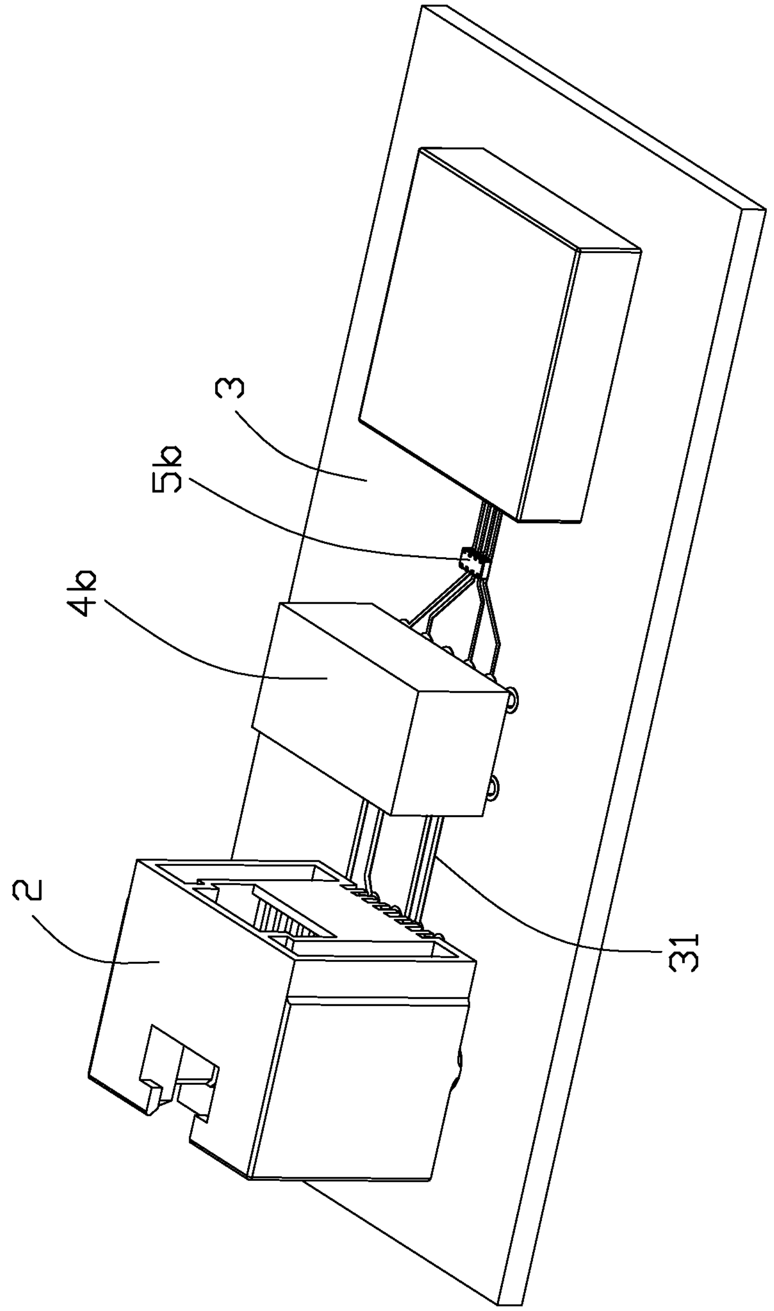
FIG. 8 is an assembled perspective view showing the electrical connector assembly of a third embodiment.

In the third embodiment shown in FIG. 8, the electrical connector 2 is connected to the transformer then to the common mode choke of one filter module in sequence, via the circuit traces 31. The transformers of the filter modules are molded into a transformer module 4*b*. The common mode chokes of the filter modules are molded into a common mode choke module 5*b*.

Figure 9:
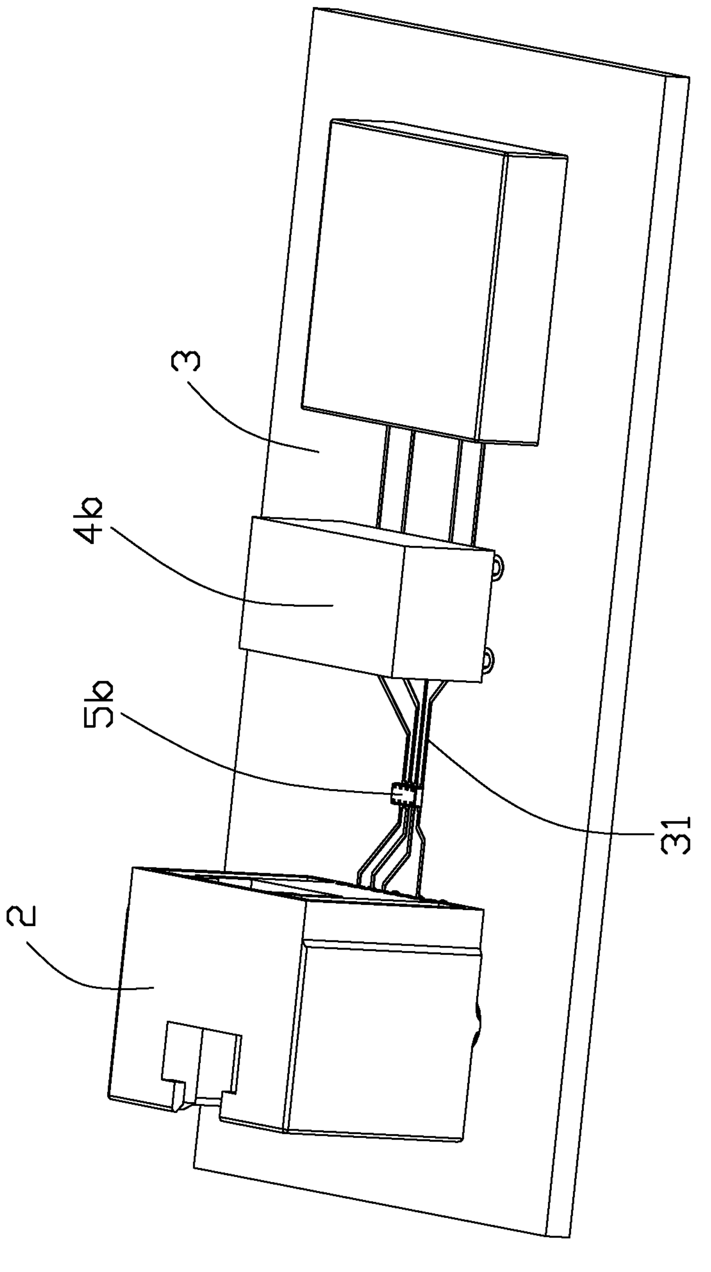
FIG. 9 is an assembled perspective view showing an electrical connector assembly of a fourth embodiment.

In the fourth embodiment shown in FIG. 9, the electrical connector 2 is connected to the common mode choke then to the transformer of one filter module in sequence, via the circuit traces 31. The common mode chokes of the filter modules are molded into a common mode choke module 5*b*. The transformers of the filter modules are molded into a transformer module 4*b*.

The electrical connector assembly has a simple configuration since the electrical connector 2 is mounted on the mother board 3 directly to connect with the filter module mounted on the mother board 3, via the circuit traces 31 of the mother board 3.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:

a mother board having a plurality of circuit traces;

an electrical connector disposed at an upper side of the mother board and including an insulative housing having a pair of side walls, a rear wall and a cavity surrounded by the side walls and the rear wall, and a plurality of contact terminals assembled to the insulative housing and being mounted to the mother board along a first direction, each contact terminal having a contact portion exposed to the cavity; and a plurality of filter modules mounted at the upper side of the mother board and situated away from the electrical connector, said contact terminals electrically connected with the filter modules via the plurality of circuit traces of the mother board, said rear wall disposed behind the contact terminals and blocking the contact terminals exposed rearwardly at the upper side of the mother board.

2. The electrical connector assembly as claimed in claim 1, wherein said insulative housing comprises a first wall defining a plurality of passageways extending along a second direction perpendicular to the first direction, each contact terminal having a connecting portion inserted through the passageway and a mounting portion extending along the first direction and mounted on the mother board.

3. The electrical connector assembly as claimed in claim 2, wherein said insulative housing has a plurality of first ribs formed on the first wall, each of said passageways being defined between two adjacent first ribs, each contact terminal being confined between two adjacent first ribs.

4. The electrical connector assembly as claimed in claim 2, wherein said insulative housing comprises a second wall, a pair of third walls and a cavity surrounded by the first through third walls, each contact terminal having a contact portion bent from the connecting portion and positioned in the cavity.

5. The electrical connector assembly as claimed in claim 4, wherein said insulative housing has a plurality of second ribs formed on the second wall and a plurality of slots each provided between two adjacent second ribs, the contact portion of each contact terminal having a free end confined in a corresponding slot.

6. The electrical connector assembly as claimed in claim 1, wherein each filter module comprises a transformer and a common mode choke connected with the transformer.

7. The electrical connector assembly as claimed in claim 6, wherein said electrical connector is connected to the transformer and then to the common mode choke of one filter module in sequence.

8. The electrical connector assembly as claimed in claim 6, wherein said electrical connector is connected to the common mode choke and then to the transformer of one filter module in sequence.

9. The electrical connector assembly as claimed in claim 6, wherein the transformers of the filter modules are molded into a transformer module and the common mode chokes of the filter modules are molded into a common mode choke module.

10. A method of manufacturing an electrical connector assembly, comprising the steps of:

providing a mother board having a plurality of circuit traces;

mounting a filter module on an upper side of the mother board;

mounting an electrical connector having an insulative housing having a rear wall and a plurality of contact terminals assembled to the insulative housing on the mother board along an up-to-bottom direction at a position away from the filter module to electrically connect said contact terminals with the filter modules via the circuit traces of the mother board, said rear wall disposed behind the contact terminals and blocking the contact terminals exposed rearwardly at the upper side of the mother board.

11. The method of manufacturing an electrical connector assembly as claimed in claim 10, wherein said contact terminal is assembled to the insulative housing by bending a rear portion thereof perpendicularly to form a mounting portion, followed by inserting a connecting portion thereof through a passageway of the insulative housing from a back-to-front direction, and finally by bending a front portion thereof obliquely to form a contact portion positioned in a cavity of the insulative housing.

12. An electrical connector assembly comprising:

a printed circuit board defining two opposite surfaces with a plurality of traces thereon;

a modular jack mounted upon a RJ side of the printed circuit board and including eight contacts mechanically and electrically connected to corresponding traces;

only one transformer mounted upon the printed circuit board in a surface mount manner and electrically connected to all said eight contacts via corresponding traces; and only one common mode choke mounted upon the printed circuit board in a surface-mount manner and electrically connected to all said eight contacts via corresponding traces; wherein said transformer and said common mode choke are electrically connected to the corresponding contacts in series before the contacts electrically connect to a component located on a PHY side of the printed circuit board; wherein both said only one transformer and said only one common mode choke are commonly mounted upon a same only one of said two opposite surfaces.

* * * * *